(12) United States Patent
Sun et al.

(10) Patent No.: US 7,456,878 B1
(45) Date of Patent: Nov. 25, 2008

(54) METHOD OF COLOR FILTER DESIGN AND COLOR REPRODUCTION UNDER THE EFFECT OF PIXEL CROSSTALK IN CMOS IMAGE SENSORS

(75) Inventors: Qun Sun, Cupertino, CA (US); Hui Tian, Cupertino, CA (US); Chen Feng, Bothell, WA (US); Jim Li, San Jose, CA (US)

(73) Assignee: MagnaChip Semiconductor Ltd., Cheongju-si (KR)

( * ) Notice: Subject to any disclaimer, the term of this patent is extended or adjusted under 35 U.S.C. 154(b) by 771 days.

(21) Appl. No.: 11/128,104

(22) Filed: May 11, 2005

(51) Int. Cl.
  *H04N 5/217* (2006.01)
  *H04N 5/335* (2006.01)
  *H04N 3/14* (2006.01)
  *H04N 9/083* (2006.01)
  *G06K 9/00* (2006.01)

(52) U.S. Cl. ................... 348/241; 348/273; 348/294; 382/167

(58) Field of Classification Search ................. 348/272, 348/273, 281; 382/167
See application file for complete search history.

(56) References Cited

U.S. PATENT DOCUMENTS

| 7,305,141 B2 * | 12/2007 | Jaspers | 382/260 |
| 2006/0098868 A1 * | 5/2006 | Fainstain et al. | 382/167 |

* cited by examiner

*Primary Examiner*—Ngoc-Yen Vu
*Assistant Examiner*—Leslie Virany
(74) *Attorney, Agent, or Firm*—DLA Piper LLP US

(57) ABSTRACT

The present invention is directed at method of designing a Color Filter Arrays (CFA) for CMOS image sensors under the effects of crosstalk for optimal color reproduction. Instead of a focus on lowering crosstalk, a novel method of designing color filter spectral responses to compensate for the effect of crosstalk at the color imaging system level is proposed. As part of this method, a color reproduction model for CMOS and CCD image sensor under the effect of crosstalk is also proposed.

18 Claims, 4 Drawing Sheets

METHOD OF COLOR FILTER DESIGN AND COLOR REPRODUCTION UNDER THE EFFECT OF PIXEL CROSSTALK IN CMOS IMAGE SENSORS

BACKGROUND

1. Field

This invention relates to the field of digital image processing, in particular the design and optimization of Color Filter Arrays for CMOS image sensors.

2. Related Art

To the average consumer of digital imaging products, the pixel count, or the number of 'mega pixels', is synonymous with image quality. Consequently, there is a trend amongst consumers to buy the digital imaging device that advertises the largest pixel count in their price range. As a result of this positive feedback, sensor manufactures are fiercely competing to roll out larger and larger format sensors with ever shrinking pixel size. Shrinking sensor pixel size, however, poses significant challenges to sensor design.

As pixels size decreases, the pixel crosstalk inevitably increases. Crosstalk describes the phenomena in which photons falling on one pixel are "falsely" sensed by surrounding pixels. For example, crosstalk occurs when highly focused light is directed to hit only a red colored pixel, yet the surrounding green and blue colored pixels show a response as demonstrated in FIG. 1. In this extreme case, the green channel response will be too high and skew the real pixel color. It is commonly understood that the crosstalk degrades the spatial resolution, reduces overall sensitivity, causes color signal mixing and, consequently, leads to image error after color correction. Reducing the effect of crosstalk in small pixels, therefore, has become one of the major goals in CMOS image sensor design.

Hence there is a need for a method in color filter design to compensate for the crosstalk in color imaging at the system level. Part of this method is a color reproduction model for CMOS and CCD image sensor under the effect of pixel crosstalk.

SUMMARY

Embodiments of the present invention include methods for designing Color Filter Arrays (CFA's) for CMOS image sensors under the effects of crosstalk. In one embodiment, the present invention includes illuminating a single pixel, determining the spectral sensitivity of that pixel and the pixels surrounding it as a function wavelength, compiling the cumulative spectral sensitivity of some number of pixel into a crosstalk characteristic function, using that crosstalk characteristic function to generate a color reproduction model and then, in an iterative fashion, optimizing the spectral response curves of the color filter array to produce the most accurate color reproduction.

In one embodiment, the primary wavelength of the incident light is controlled using a monochromator so that the full range of the spectrum of interest can be incrementally stepped through in narrowband steps.

In one embodiment, the incident light is projected onto only one pixel at a time using a highly focus beam of light. In such an embodiment, only the pixel under measurement is illuminated while all other pixels on the image sensor remain dark.

In one embodiment, a metal mask layer on the image sensor itself is used to block light from hitting all but the one pixel under measurement.

In one embodiment, the crosstalk characteristic function can be generated by simulation of the spectral sensitivity of individual pixels using a process simulator and a device simulator.

In one embodiment, the crosstalk characteristic function can be approximated as super-linear function that takes into consideration the wavelength spectrum of interest and the maximum and minimum spectral sensitivity responses of the all pixels measured.

In one embodiment, the optimization of the CFA is based on comparing a merit function of the color reproduction model against a predetermined threshold value the same merit function.

In one embodiment, the color reproduction model generated takes into account the spectral sensitivity under the effects of crosstalk for each color channel as the sum of the spectral sensitivity component of the primary color of a particular color channels and the contribution of the crosstalk signal of all other surrounding pixels within some area.

DETAILED DESCRIPTION

Described herein are techniques for optimizing Color Filter Arrays (CFA's) for imaging sensors under the effects of crosstalk. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1:
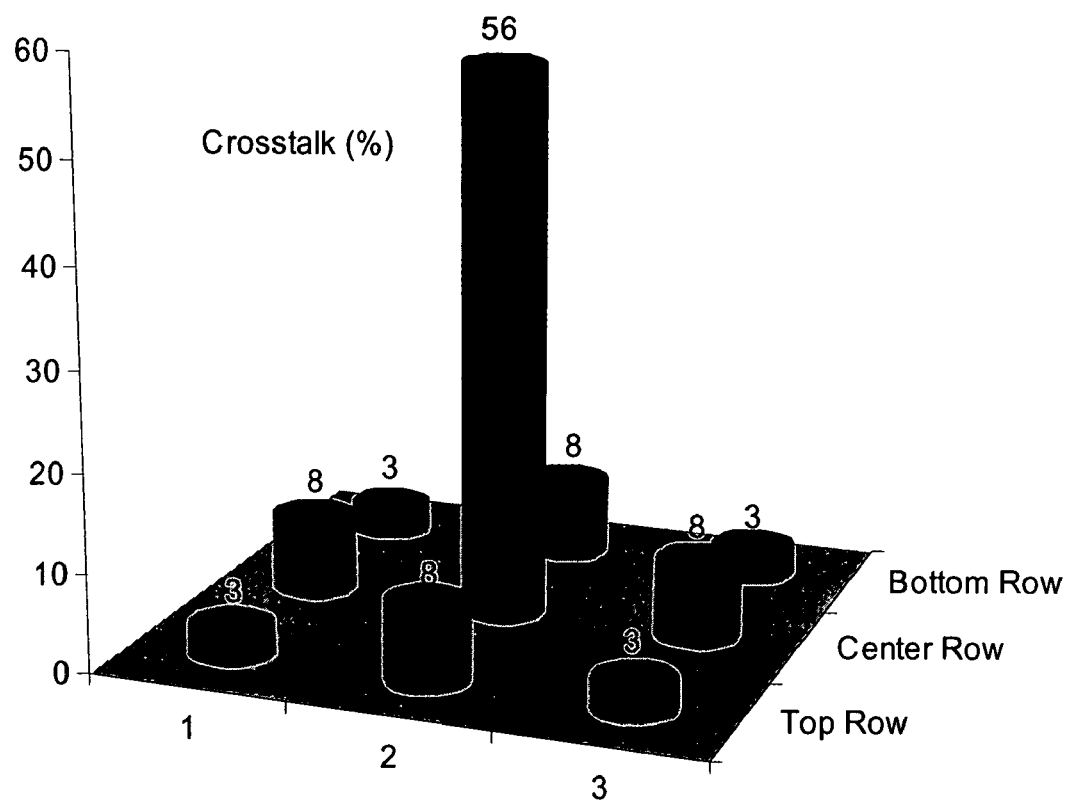
FIG. 1 is a diagram illustrating the spectral sensitivity of an individually illuminated red pixel and the spectral sensitivity of the surrounding blue and green pixels due to the effects of crosstalk.
Figure 2:
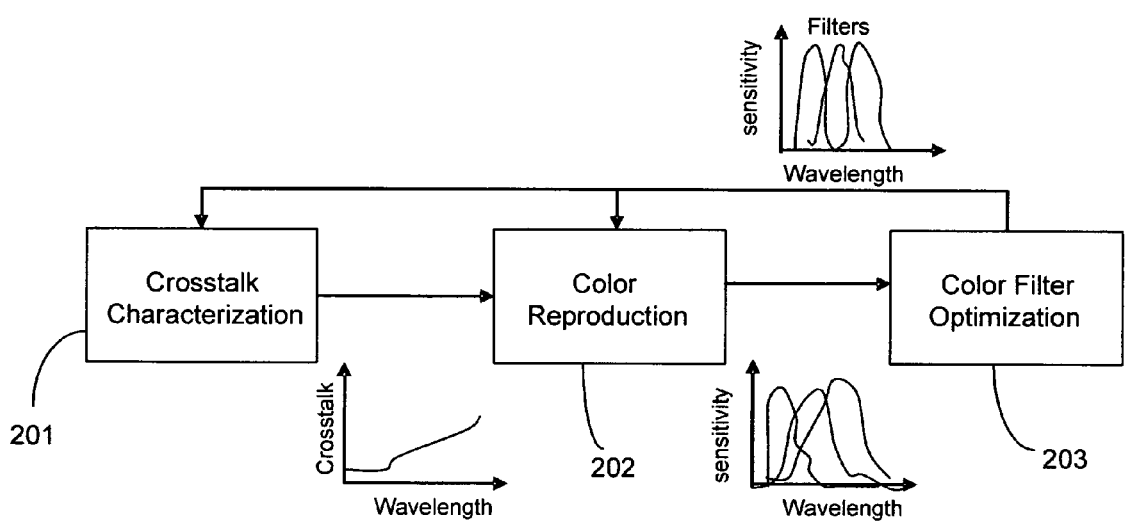
FIG. 2 is a diagram illustrating flow chart of an iterative method of designing Color Filter Arrays (CFAs) for CMOS image sensors according to one embodiment of the present invention.

FIG. 2 is a flow chart illustrating the iterative process of color filter array optimization according to one embodiment of the present invention. Color filters of a color filter array in the CMOS image sensor are optimized to compensate for the effect of crosstalk, and hence achieve the best color reproduction. It is conceived that this method can be also extended to CCD image sensor applications. The optimization process depicted in FIG. 2 comprises three sub processes; crosstalk characterization 201, color reproduction under crosstalk 202, and color filter optimization 203.

In one embodiment, one iteration of the process comprises four steps. In the first step, the relationship between crosstalk and photon wavelength in the image sensors is characterized with a crosstalk characteristic function. This function is typically expressed as the percentage of crosstalk signal as a function of wavelength. In the second step, based on the crosstalk characteristic function and a novel color reproduction model proposed in this invention, the spectral sensitivity of the whole image sensor is obtained. Then the spectral sensitivity of the image sensor system can be optimized by optimizing the selection of color filters used in color filter array (CFA) in the third step. In practice, however, due to the manufactory limitations on the shape of the spectral response curves of the color filters, the whole optimization and selection can be performed in an iterative way to obtain the best selection of color filters, hence achieve the best color reproduction for the image sensor system. Therefore, the fourth step is iterative feedback step. Optimized color filters obtained in the third step are fed back into the 1st and 2nd steps to re-characterize crosstalk and re-perform the color reproduction.

Crosstalk Characterization

Traditionally, crosstalk of an image sensor is measured using while light, a certain lighting illuminant containing a whole range of wavelength components. The crosstalk measured using this method in an accumulated result for a whole range of wavelengths limited by the sensor and the illuminant. Recent research, however, has indicated that the pixel crosstalk in silicon image sensors is strongly wavelength dependent. Generally speaking, the pixel crosstalk increases monotonically with wavelength in the visible range. For accurate crosstalk characteristics, characterization should therefore be performed with a wavelength controlled light source. Such characterization can be obtained using either real measurement or simulation.

In one embodiment, actual measurement of the crosstalk characteristics is achieved using a spectral monochromator system. The spectral monochromator system provides calibrated lighting with controlled narrow band light over the whole range of the visible spectrum or any other range of interest.

In one embodiment, an imaging system is used to provide illumination on a single pixel only. The single pixel could be one of any of the available colored pixels, such as a red, green or blue when using a Bayer color filter array.

According to the present invention, two techniques can be used for isolating light onto a single pixel in crosstalk characterization measurement. In one embodiment, highly focused lighting is directed so that only a single pixel will be illuminated. Optionally, the light can be near perfectly collimated so as to avoid crosstalk between pixels due to a diverging incoming beam after as the light is absorbed in the silicon.

In another embodiment, a metal mask inside silicon sensor is used to block light from hitting all but a single pixel. Using either of the foregoing selective pixel illumination techniques in conjunction with a selectable wavelength light source, the crosstalk characteristics function for a particular color pixel relative to its neighboring pixels can be measured.

In one embodiment, the crosstalk characteristics function used for the following color reproduction estimation is an accumulated result considering simultaneous effect from all pixels of the whole image sensor.

In another embodiment, a reliable approximation of the crosstalk characteristics function may be achieved by using small blocks of pixels, such as blocks of 3×3, 5×5 and 7×7 pixels.

In yet another embodiment, some average operations may also be required to performed to achieve a reliable crosstalk characteristics function.

Optionally, measurement of the crosstalk characteristics function can be also performed for pixels of a 'raw' image sensor without using a CFA or micro-lenses.

In one embodiment, the crosstalk characteristics function is obtained by using one of many mature and complex commercial process simulator tools. For example, commercial process simulator Athena and device simulator Atlas can be applied to simulate the crosstalk in CMOS image sensors.

Figure 3:
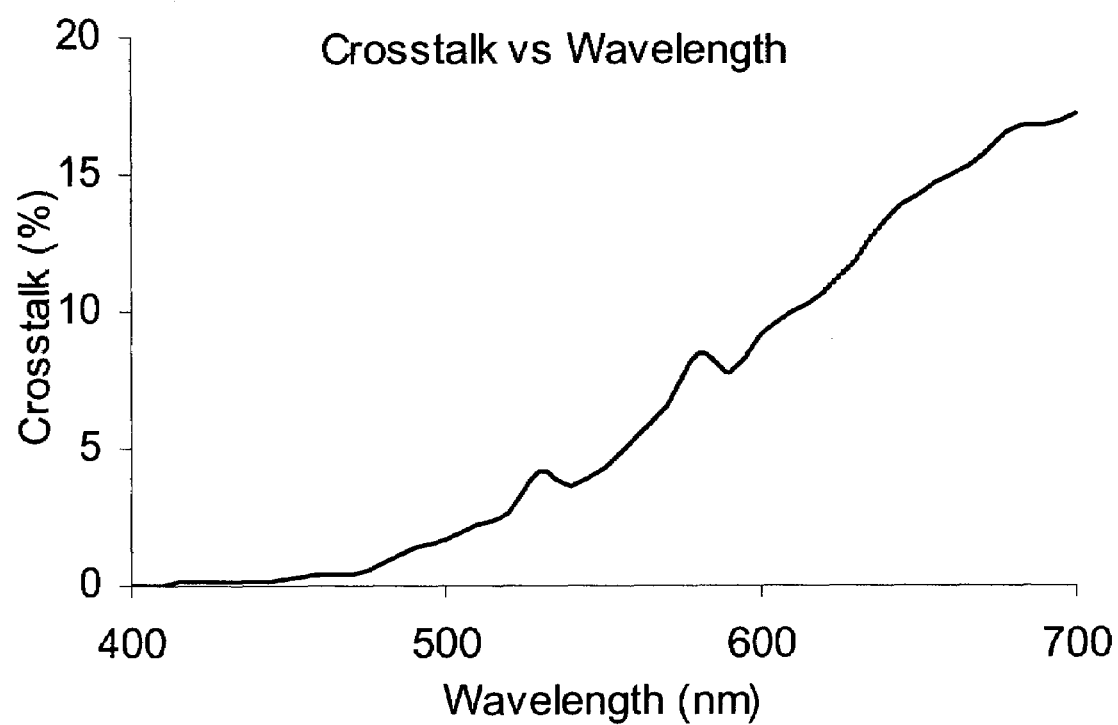
FIG. 3 is a diagram illustrating an example of a crosstalk characteristic function according to one embodiment of the present invention.

In one embodiment, the simulation comprises the following steps: First, a brief process flow including all major mask steps and thermal cycles is constructed using a process simulator. The process flow is then calibrated against SIMS (Secondary Ion Mass Spectrometry) data. The process simulation results are then fed into a device model comprising a row of pixels of interest. Finally, device simulation is performed to study the optoelectronic behavior of the structure and generate the crosstalk characteristics function. An example of crosstalk characteristics function is shown in FIG. 3.

Figure 4:
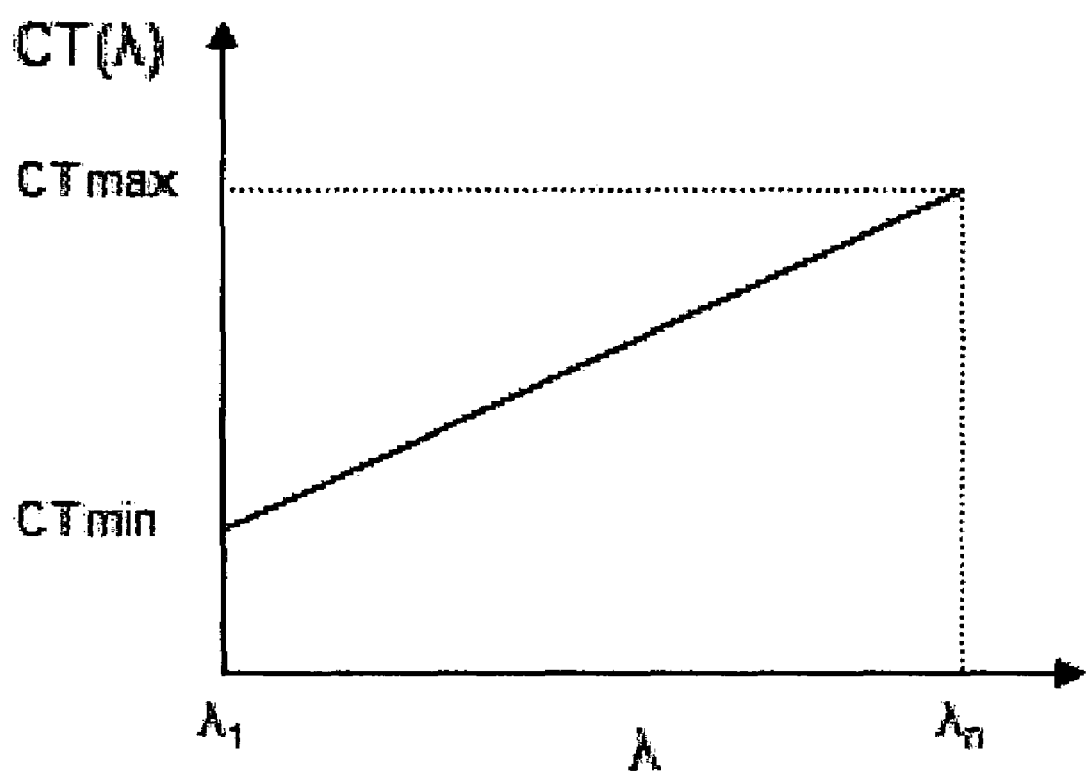
FIG. 4 is a diagram illustrating an example of a crosstalk characteristic function as approximated by a super-linear function according to one embodiment of the present invention.

In one embodiment, a good approximation of crosstalk characteristics function can be represented by a super-linear model as shown in FIG. 4 and Equation 1.

$$CT(\lambda) = a + b \cdot \lambda \qquad (1)$$

where $$a = \frac{\lambda_n \cdot CT_{\min} - \lambda_1 \cdot CT_{\max}}{\lambda_{\max} - \lambda_1}, \quad b = \frac{CT_{\max} - CT_{\min}}{\lambda_n - \lambda_1}$$

Where the $\lambda_1$ and $\lambda_n$ represent the range of visible wavelength, $CT_{min}$ and $CT_{max}$ are the minimum and maximum values of crosstalk corresponding to $\lambda_1$ and $\lambda_n$, respectively. The $\lambda_1$ and $\lambda_n$ can be selected as 400 nm and 700 nm for the visible wavelength. $CT_{min}$ and $CT_{max}$ should be selected based on real image sensor characteristics. In practice, piece-wide super-linear models can be used to accurately represent the crosstalk function in wavelengths over the visible range.

Color Reproduction under Crosstalk

Currently, there are no existing color reproduction models to describe the color or special responses of CMOS or CCD image sensor under the effects of crosstalk. In the present invention, a novel color reproduction model to describe the spectral sensitivity of an image sensor system under the effect of pixel crosstalk is proposed. The spectral sensitivities of color pixels or channels, including color filters, micro-lenses and black-white spectral sensitivity in a CMOS image sensor can be represented as:

$$R_{ct}(\lambda) = R_{rr}(\lambda) + G_{gr}(\lambda) + B_{br}(\lambda)$$

$$G_{ct}(\lambda) = R_{rg}(\lambda) + G_{gg}(\lambda) + B_{bg}(\lambda) \qquad (2)$$

$$B_{ct}(\lambda) = R_{rb}(\lambda) + G_{gb}(\lambda) + B_{bb}(\lambda)$$

where $R_{ct}(\lambda)$, $G_{ct}(\lambda)$, $B_{ct}(\lambda)$ are the composite spectral sensitivities for red, green and blue pixels in a Bayer CFA, respectively. $R_{rr}(\lambda)$, $G_{gg}(\lambda)$, $B_{bb}(\lambda)$ are the primary spectral sensitivities components of a pixel of a particular color. For example, $R_{rr}(\lambda)$ is the red signal contribution when measuring a red pixel. $G_{gr}(\lambda)$ is the spectral sensitivity factor contributed from green pixels to red pixels due to the pixel crosstalk and so on and so forth. Other variables on the right side of Equation 2 have similar definitions as $G_{gr}(\lambda)$. It is worth noting that Equation 2 averages the difference between two types of green pixels. If necessary, in practice, Eq. 2 is flexible to be extended for two different types of green pixels.

In one embodiment, Equation 2 can be rewritten in different formats for different application considerations. For example, the crosstalk characteristics function can be measured without the CFA and defined as a function of wavelength, $CT(\lambda)$. Assuming the pixel crosstalk is independent of CFA, Equation 2 can be written as:

$$R_{ct}(\lambda)=k_r(\lambda)\cdot[W_{rr}(\lambda)\cdot R(\lambda)+W_{gr}(\lambda)\cdot G(\lambda)+W_{br}(\lambda)\cdot B(\lambda)]$$

$$G_{ct}(\lambda)=k_g(\lambda)\cdot[W_{rg}(\lambda)\cdot R(\lambda)+W_{gg}(\lambda)\cdot G(\lambda)+W_{bg}(\lambda)\cdot B(\lambda)] \quad (3)$$

$$B_{ct}(\lambda)=k_b(\lambda)\cdot[W_{rb}(\lambda)\cdot R(\lambda)+W_{gb}(\lambda)\cdot G(\lambda)+W_{bb}(\lambda)\cdot B(\lambda)]$$

where $k_r(\lambda)$, $k_g(\lambda)$, $k_b(\lambda)$ are wavelength dependent factors related to micro-lens and black-white spectral sensitivity of the image sensor for red, green and blue pixels respectively, and $R(\lambda)$, $G(\lambda)$, $B(\lambda)$ are the spectral sensitivities for the color filters of CFA, $W_{ij}(\lambda)$ are crosstalk factors related to $CT(\lambda)$ contributed from i color pixels of j color pixels when using Bayer CFA. Optionally, $k_r(\lambda)$, $k_g(\lambda)$, $k_b(\lambda)$ can be treated as the same for different color pixels.

In one embodiment, only the crosstalk in a block of 3×3 pixels is considered for each center test pixel. Based on experimental results, the decrease of crosstalk between two pixels can be approximated as a simple function of $1/d^2$, where d is the distance from the illuminated pixel to its neighboring pixels, instead of as an exponential function. For example, using Bayer CFA, if an overall 20% crosstalk is measured in the center pixel, then the crosstalk for its neighboring pixels on the diagonal will be 20%/12, and the crosstalk for its neighboring pixels on the vertical and horizontal will be 20%/6. Equation. 3 can then be represented in detail as Equation 4.

$$R_{ct}(\lambda)=k_r(\lambda)\cdot[(1-CT(\lambda))\cdot R(\lambda)+4(CT(\lambda)/6)\cdot G(\lambda)+4(CT(\lambda)/12)\cdot B(r)]$$

$$G_{ct}(\lambda)=k_g(\lambda)\cdot[2(CT(\lambda)/6)\cdot R(\lambda)+(1-CT(\lambda))\cdot G(\lambda)+2(CT(\lambda)/6)\cdot B(\lambda)] \quad (4)$$

$$B_{ct}(\lambda)=k_b(\lambda)\cdot[4(CT(\lambda)/12)\cdot R(\lambda)+4(CT(\lambda)/6)\cdot G(\lambda)+(1-CT(\lambda))\cdot B(\lambda)]$$

It is worth noting that Equation 4 represents the average effect and ignores the difference between two green channels of the Bayer pattern in CMOS image sensor. It is also worth noting that the energy is not conserved in Equation 4 since the block using 3×3 pixels is not a closed system.

In one embodiment, in which crosstalk is measured with a CFA, the Equation 2 can be rewritten as Equation 5:

$$R_{ct}(\lambda)=k_r(\lambda)\cdot[(1-CT_{rr}(\lambda))\cdot R(\lambda)+CT_{gr}(\lambda)\cdot G(\lambda+CT_{br}(\lambda)\cdot B(\lambda)]$$

$$G_{ct}(\lambda)=k_g(\lambda)\cdot[CT_{rg}(\lambda)\cdot R(\lambda)+(1-CT_{gg}(\lambda))\cdot G(\lambda)+CT_{hg}(\lambda)\cdot B(\lambda)] \quad (5)$$

$$B_{ct}(\lambda)=k_h(\lambda)\cdot[CT_{rh}(\lambda)\cdot R(\lambda)+CT_{gh}(\lambda)\cdot G(\lambda)+(1-CT_{bb}(\lambda))\cdot B(\lambda)]$$

where $R(\lambda)$, $G(\lambda)$, $B(\lambda)$ are the spectral sensitivities for the color filters of CFA, $CT_{rr}(\lambda)$, $CT_{gg}(\lambda)$, $CT_{bb}(\lambda)$ are sensitivity loses due to crosstalk from red, green and blue pixels to their neighboring pixels, respectively. In Equation 5, $CT_{gr}(\lambda)$ is the crosstalk factor contributed from green pixels to red pixels, $CT_{br}(\lambda)$ is the crosstalk factor contributed from blue pixels to red pixels and so on and so forth. The rest of the variables in the right side of Equation 5 have the similar definitions such that $CT_{xy}(\lambda)$ is the crosstalk factor contributed from x color pixels to y color pixels.

Optimization for Color Filters

Colorimetrically, the accuracy of color reproduction is based on how closely the spectral responses of the image sensor match the human vision responses. Mathematically, this can be described as how close the spectral sensitivities of the image sensor match the color matching functions or their linear combinations (when noise is not involved). Thus, the design goal should be to optimize the spectral responses of the whole image sensor system, $R_{ct}(\lambda)$, $G_{ct}(\lambda)$, $B_{ct}(\lambda)$ as shown in the Equations 2 to 5, to achieve the best color reproduction. The optimal color filters here will provide us the best overall color reproduction for the image sensor system.

There are many quality metrics to measure the goodness of spectral sensitivities of an image sensor, such as q-factor, μ-factor, $Q_{st}$ and $Q_{sf}$, Figure of Merit and Unified Measure of Goodness. Noise effects can be also considered in some of these metrics. In one embodiment of the present invention, it is possible to choose one or more of the aforementioned metrics to perform the optimization for the spectral sensitivities of the image sensor and thus obtain the optimal color filters required.

Feedback Loop in Design Chain

As discussed for FIG. 2, in one embodiment, due to the manufactory limitations on the shape of the spectral response curve of color filters, optimization and selection of color filters are performed in an iterative way so as to obtain the best selection of the color filters under such limitations. The manufactory can then attempt to fabricate color filters based on the optimize results.

In one embodiment, due to manufacturing limitations, the color filters manufactured may differ to the optimal ones. Therefore, the crosstalk characteristics might be changed and need to be re-characterized or simulated. The spectral sensitivities of an image sensor using the color filters may also change and need to be re-modeled. By performing this iterative feedback process, an optimal set of color filters can be obtained.

The foregoing description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, color filter optimization and design methods according to the present invention may include some or all of the innovative features described above. Based on the above disclosure and the following claims, other arrangements, embodiments, implementations and equivalents will be evident to those skilled in the art and may be employed without departing from the spirit and scope of the invention as defined by the claims.

We claim:

1. A method of designing a color filter array, having spectral response curves for all color channels, for digital imaging sensors under the effect of crosstalk comprising:
   determining a crosstalk characteristic function using cumulative effects of up to all pixels on a image sensor;
   modeling color reproduction based on said crosstalk characteristic function and said spectral response curves;
   optimizing said spectral response curves of said color filter array wherein the shape of the spectral response curves for as many as all color channels extant on the image sensor are selected to optimize the accuracy of color reproduction; and,
   inputting the optimized spectral response curves of said color filter array back to the determining crosstalk characteristic function and generating a color reproduction model steps until a predetermined metric threshold is reached or exceeded by some predetermined amount.

2. The method of claim 1 wherein a value of q-factor, μ-factor, $Q_{st}$ and $Q_{sf}$, Figure of Merit, Unified Measure of Goodness or other quality metric of the goodness of spectral sensitivities of an image sensor is calculated in said modeling color reproduction step, wherein said optimizing said spectral response curves of said color filter array step is based on decreasing the difference between a predetermined threshold value of q-factor, μ-factor, $Q_{st}$ and $Q_{sf}$, Figure of Merit, Unified Measure of Goodness or other quality metric of the goodness of spectral sensitivities of an image sensor and said value of q-factor, μ-factor, $Q_{st}$ and $Q_{sf}$, Figure of Merit, Unified Measure of Goodness or other quality metric of the goodness of spectral sensitivities of an image sensor calculated in said modeling color reproduction step.

3. The method of claim 1 wherein said determining crosstalk characteristic functions step is achieved by direct measurement of the spectral response of individual pixels as a function of wavelength using a monochromator to step through a range of wavelengths to illuminate said pixels one wavelength band at a time.

4. The method of claim 3 wherein a value of q-factor, μ-factor, $Q_{st}$ and $Q_{sf}$, Figure of Merit, Unified Measure of Goodness or other quality metric of the goodness of spectral sensitivities of an image sensor is calculated in said modeling color reproduction step, wherein said optimizing said spectral response curves of said color filter array step is based on decreasing the difference between a predetermined threshold value of q-factor, μ-factor, $Q_{st}$ and $Q_{sf}$, Figure of Merit, Unified Measure of Goodness or other quality metric of the goodness of spectral sensitivities of an image sensor and said value of q-factor, μ-factor, $Q_{st}$ and $Q_{sf}$, Figure of Merit, Unified Measure of Goodness or other quality metric of the goodness of spectral sensitivities of an image sensor calculated in said modeling color reproduction step.

5. The method of claim 3 wherein light from said monochromator is focused so that only a single pixel is illuminated at a time.

6. The method of claim 5 wherein a value of q-factor, μ-factor, $Q_{st}$ and $Q_{sf}$, Figure of Merit, Unified Measure of Goodness or other quality metric of the goodness of spectral sensitivities of an image sensor is calculated in said modeling color reproduction step, wherein said optimizing said spectral response curves of said color filter array step is based on decreasing the difference between a predetermined threshold value of q-factor, μ-factor, $Q_{st}$ and $Q_{sf}$, Figure of Merit, Unified Measure of Goodness or other quality metric of the goodness of spectral sensitivities of an image sensor and said value of q-factor, μ-factor, $Q_{st}$ and $Q_{sf}$, Figure of Merit, Unified Measure of Goodness or other quality metric of the goodness of spectral sensitivities of an image sensor calculated in said modeling color reproduction step.

7. The method of claim 3 wherein a metal mask is applied to the digital imaging sensor so that only one pixel is exposed at a time.

8. The method of claim 7 wherein a value of q-factor, μ-factor, $Q_{st}$ and $Q_{sf}$, Figure of Merit, Unified Measure of Goodness or other quality metric of the goodness of spectral sensitivities of an image sensor is calculated in said modeling color reproduction step, wherein said optimizing said spectral response curves of said color filter array step is based on decreasing the difference between a predetermined threshold value of q-factor, μ-factor, $Q_{st}$ and $Q_{sf}$, Figure of Merit, Unified Measure of Goodness or other quality metric of the goodness of spectral sensitivities of an image sensor and said value of q-factor, μ-factor, $Q_{st}$ and $Q_{sf}$, Figure of Merit, Unified Measure of Goodness or other quality metric of the goodness of spectral sensitivities of an image sensor calculated in said modeling color reproduction step.

9. The method of claim 1 wherein said determining crosstalk characteristic functions step is achieved by simulation.

10. The method of claim 9 wherein a value of q-factor, μ-factor, $Q_{st}$ and $Q_{sf}$, Figure of Merit, Unified Measure of Goodness or other quality metric of the goodness of spectral sensitivities of an image sensor is calculated in said modeling color reproduction step, wherein said optimizing said spectral response curves of said color filter array step is based on decreasing the difference between a predetermined threshold value of q-factor, μ-factor, $Q_{st}$ and $Q_{sf}$, Figure of Merit, Unified Measure of Goodness or other quality metric of the goodness of spectral sensitivities of an image sensor and said value of q-factor, μ-factor, $Q_{st}$ and $Q_{sf}$, Figure of Merit, Unified Measure of Goodness or other quality metric of the goodness of spectral sensitivities of an image sensor calculated in said modeling color reproduction step.

11. The method of claim 9 wherein said simulation comprises;
constructing a process flow including all major mask steps and thermal cycles using a process simulator;
calibrating said process flow against Secondary Ion Mass Spectrometry data; and,
entering said calibrated process flow into a device simulator;
constructing the crosstalk characteristic function using said device simulator.

12. The method of claim 11 wherein a value of q-factor, μ-factor, $Q_{st}$ and $Q_{sf}$, Figure of Merit, Unified Measure of Goodness or other quality metric of the goodness of spectral sensitivities of an image sensor is calculated in said modeling color reproduction step, wherein said optimizing said spectral response curves of said color filter array step is based on decreasing the difference between a predetermined threshold value of q-factor, μ-factor, $Q_{st}$ and $Q_{sf}$, Figure of Merit, Unified Measure of Goodness or other quality metric of the goodness of spectral sensitivities of an image sensor and said value of q-factor, μ-factor, $Q_{st}$ and $Q_{sf}$, Figure of Merit, Unified Measure of Goodness or other quality metric of the goodness of spectral sensitivities of an image sensor calculated in said modeling color reproduction step.

13. The method of claim 1 wherein said crosstalk characteristic function is approximated as linear function $CT(\lambda)=a+b\cdot\lambda$ wherein $$a = \frac{\lambda_n \cdot CT_{\min} - \lambda_1 \cdot CT_{\max}}{\lambda_{\max} - \lambda_1}$$

and $$b = \frac{CT_{\max} - CT_{\min}}{\lambda_n - \lambda_1}$$

where the $\lambda_1$ and $\lambda_n$ represent the extremes of the range of wavelengths, $CT_{min}$ and $CT_{max}$ are the minimum and maximum values of crosstalk corresponding to $\lambda_1$ and $\lambda_n$, respectively.

14. The method of claim 1 wherein said crosstalk characteristic function is set of piece wise linear functions wherein each linear function is $CT_b(\lambda)=a_b+b_b\cdot\lambda$ wherein $$a = \frac{\lambda_{bn} \cdot CT_{\min_b} - \lambda_{b1} \cdot CT_{\max_b}}{\lambda_{\max_b} - \lambda_{1_b}}$$

and $$b_b = \frac{CT_{\max_b} - CT_{\min_b}}{\lambda_{nb} - \lambda_{1b}}$$

where the $\lambda_{1b}$ and $\lambda_{nb}$ represent the extremes of the range of wavelengths of the $b^{th}$ band of the overall wavelength range of the crosstalk characteristic function, $CT_{minb}$ and $CT_{mabx}$ are the minimum and maximum values of crosstalk corresponding to $\lambda_{1b}$ and $\lambda_{nb}$, respectively.

15. The method of claim 14 wherein a value of q-factor, μ-factor, $Q_{st}$ and $Q_{sf}$, Figure of Merit, Unified Measure of Goodness or other quality metric of the goodness of spectral sensitivities of an image sensor is calculated in said modeling color reproduction step, wherein said optimizing said spectral response curves of said color filter array step is based on decreasing the difference between a predetermined threshold value of q-factor, μ-factor, $Q_{st}$ and $Q_{sf}$, Figure of Merit, Unified Measure of Goodness or other quality metric of the goodness of spectral sensitivities of an image sensor and said value of q-factor, μ-factor, $Q_{st}$ and $Q_{sf}$, Figure of Merit, Unified Measure of Goodness or other quality metric of the goodness of spectral sensitivities of an image sensor calculated in said modeling color reproduction step.

16. The method of claim 1 wherein said modeling color reproduction step is based on the equations $R_{ct}(\lambda) = R_{rr}(\lambda) + G_{gr}(\lambda) + B_{br}(\lambda)$, $G_{ct}(\lambda) = R_{rg}(\lambda) + G_{gg}(\lambda) + B_{bg}(\lambda)$, and $B_{ct}(\lambda) = R_{rb}(\lambda) + G_{gb}(\lambda) + B_{bb}(\lambda)$ where $R_{ct}(\lambda)$, $G_{ct}(\lambda)$, $B_{ct}(\lambda)$ are the respective composite spectral sensitivities for red, green and blue pixels in a Bayer color filter array (CFA), $R_{rr}(\lambda)$, $G_{gg}(\lambda)$, $B_{bb}(\lambda)$ are the primary spectral sensitivities components of red, green and bluish pixels respectively, $R_{rg}(\lambda)$ is the spectral sensitivity contribution of red pixels to green pixels due to crosstalk, $R_{rb}(\lambda)$ is the spectral sensitivity contribution of red pixels to blue pixels due to crosstalk, $G_{gr}(\lambda)$ is the spectral sensitivity contribution of green pixels to red pixels due to crosstalk, $G_{gb}(\lambda)$ is the spectral sensitivity contribution of green pixels to blue pixels due to crosstalk, $B_{br}(\lambda)$ is the spectral sensitivity contribution of blue pixels to red pixels due to crosstalk and $B_{bg}(\lambda)$ is the spectral sensitivity contribution of blue pixels to green pixels due to crosstalk.

17. The method of claim 16 wherein a value of q-factor, μ-factor, $Q_{st}$ and $Q_{sf}$, Figure of Merit, Unified Measure of Goodness or other quality metric of the goodness of spectral sensitivities of an image sensor is calculated in said modeling color reproduction step, wherein said optimizing said spectral response curves of said color filter array step is based on decreasing the difference between a predetermined threshold value of q-factor, μ-factor, $Q_{st}$ and $Q_{sf}$, Figure of Merit, Unified Measure of Goodness or other quality metric of the goodness of spectral sensitivities of an image sensor and said value of q-factor, μ-factor, $Q_{st}$ and $Q_{sf}$, Figure of Merit, Unified Measure of Goodness or other quality metric of the goodness of spectral sensitivities of an image sensor calculated in said modeling color reproduction step.

18. The method of claim 1 wherein said modeling color reproduction step is based on said crosstalk characteristic function and said spectral response curves are only those available to a particular color filter array manufacturing process.

* * * * *